(12) United States Patent
Zagrebelny

(10) Patent No.: US 6,863,595 B1
(45) Date of Patent: Mar. 8, 2005

(54) METHODS FOR POLISHING A SEMICONDUCTOR TOPOGRAPHY

(75) Inventor: Andrey Zagrebelny, Eagan, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 175 days.

(21) Appl. No.: 10/025,511

(22) Filed: Dec. 19, 2001

(51) Int. Cl.[7] .......................................... B24B 7/22
(52) U.S. Cl. .................................. 451/41; 451/37
(58) Field of Search ........................ 451/41, 37, 36, 451/288, 60, 57

(56) References Cited

U.S. PATENT DOCUMENTS

| | | | | |
|---|---|---|---|---|
| 5,738,574 A | * | 4/1998 | Tolles et al. | ............... 451/288 |
| 5,996,594 A | * | 12/1999 | Roy et al. | .................... 134/1.3 |
| 6,130,163 A | * | 10/2000 | Yi et al. | ..................... 438/692 |
| 6,494,985 B1 | * | 12/2002 | Sotozaki et al. | ....... 156/345.12 |

* cited by examiner

*Primary Examiner*—Robert A. Rose
(74) *Attorney, Agent, or Firm*—Kevin L. Daffer; Daffer McDaniel, LLP

(57) ABSTRACT

A method is provided for processing a semiconductor topography. In an embodiment, the method includes polishing the topography on a primary polishing pad during a primary polishing step without depositing water on the primary polishing pad. The method may also include transferring the topography from the primary polishing pad to a final polishing pad. A substantial amount of residual slurry particles may be present on the topography while the topography is being transferred. In an embodiment, the method may also include polishing the topography on a final polishing pad during a final polishing step. The final polishing step may include depositing water on the final polishing pad in a plurality of dispense intervals to reduce a rate of change of a pH of a polishing solution on the topography.

20 Claims, 6 Drawing Sheets

METHODS FOR POLISHING A SEMICONDUCTOR TOPOGRAPHY

BACKGROUND OF THE INVENTION

1. Field of the Invention

This invention relates to semiconductor device manufacturing, and more particularly, to an improved method and system for polishing a semiconductor topography.

2. Description of the Related Art

The following descriptions and examples are not admitted to be prior art by virtue of their inclusion within this section.

Fabrication of an integrated circuit involves numerous processing steps. For example, isolation regions may be formed in a semiconductor substrate to separate subsequently formed active regions of the substrate. In addition, after implant regions (e.g., source/drain regions) have been placed within a semiconductor substrate and gate areas defined upon the substrate, an interlevel dielectric may be formed across the topography to isolate the gate areas and the implant regions from overlying conductors. Interconnect routing may be placed over the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

Forming substantially planar upper surfaces of a semiconductor topography during intermediate process steps may facilitate fabrication of layers and structures that meet design specifications. For example, a dielectric layer may be formed across a previously patterned layer of a semiconductor topography using a process such as chemical vapor deposition ("CVD"). Such a dielectric layer may be used to form an interlevel dielectric or shallow trench isolation regions. Elevational disparities of the deposited dielectric layer may be reduced by polishing the deposited dielectric layer using a process such as chemical mechanical polishing ("CMP"). In addition, a contact opening may be formed within a polished dielectric layer and subsequently filled with a layer of conductive material. In this manner, the layer of conductive material may be formed within the contact opening and on an upper surface of the polished dielectric layer. As such, the layer of conductive material may also be polished such that an upper surface of the contact structure may be relatively level with an upper surface of the dielectric layer.

Additional layers and structures may be formed upon such layers and structures. The additional layers and structures may include, for example, additional dielectric layers, additional contact structures, local interconnect wires, and/or metallization layers. In this manner, the polished upper surface of the dielectric layer and/or structures may facilitate the formation of such additional layers and structures having uniform vertical and lateral dimensions. For example, polishing the semiconductor topography may facilitate the formation of local interconnect structures having a substantially uniform thickness by providing a relatively planar surface upon which a dielectric material may be deposited to insulate adjacent local interconnect structures.

Moreover, polishing the semiconductor topography may aid in forming local interconnect structures having uniform lateral dimensions by providing a level surface upon which a patterned masking layer may be formed. For example, substantially planar surfaces may become increasingly important as the feature sizes of semiconductor devices are reduced, since the depth of focus required to pattern an upper surface of a semiconductor topography may increase with reductions in feature size. In addition, if a topography is non-planar, the patterned image may be distorted and the intended structure may not be formed to the specifications of the device. In particular, correctly patterning layers upon a topological surface containing elevational "hill" or "valley" areas may be difficult using optical lithography since the all parts of the topography must be within the depth of focus of the lithography system. In this manner, a masking layer may be accurately patterned by a lithography technique such that the pattern may be accurately transferred to a dielectric layer to form local interconnect structures.

Forming a substantially planar upper surface of such layers and structures may play an important role in the functionality of a semiconductor device. For example, problems with step coverage may arise when a dielectric, conductive, or semiconductive material is deposited over a topological surface having elevationally raised regions. Step coverage is defined as a measure of how well a film conforms over an underlying step and is expressed by the ratio of the minimum thickness of a film as it crosses a step to the nominal thickness of the film over horizontal regions. In another embodiment, polishing a semiconductor topography may include forming shallow trench isolation regions with substantially planar surfaces such that the aforementioned additional layers and structures may be formed with uniform thickness and with lateral dimensions within specification. Accordingly, layers and structures of a semiconductor device may be formed having dimensions, which are approximately equal to the design specifications of the semiconductor device.

As mentioned above, CMP is a technique commonly employed to polish or remove the elevational fluctuations in the surface of a semiconductor topography. A conventional CMP process may involve placing a semiconductor wafer against a backing plate of a wafer carrier in order to hold the wafer relative to an underlying polishing pad. The wafer may then be pressed face-down toward the polishing pad which lies on or is attached to a support structure. During the CMP process, the polishing pad and/or the wafer carrier may be set in motion as the wafer is forced against the pad. For example, the polishing pad and the wafer carrier may be placed on a rotatable table such that the wafer and the polishing pad may be rotated relative to each other. Alternatively, the wafer carrier may be rotated relative to a fixed pad or vice versa. In another embodiment, the polishing pad may be a belt, which traverses against a fixed or rotating wafer. In either embodiment, the rotatable table, fixed pad, or belt may serve as the support structure to which the polishing pad lies upon or is attached.

An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The movement of the polishing pad relative to the wafer causes abrasive particles entrained within the slurry to physically strip the reacted surface material from the wafer. In addition, the pad itself may physically remove some material from the surface of the semiconductor topography. Therefore, the process may employ a combination of chemical stripping and mechanical polishing to form a relatively level surface.

During polishing with a slurry, defects such as microscratches may be formed on the surface of a topography.

Microscratches may include scratches of any length having a width of less than about 0.5 μm. Such microscratches may have a depth of up to about 100 Å and may be relatively difficult to remove during final stages of polishing on a final pad. Such final pad polishing my be designed to remove relatively little material from a topography thereby essentially "smoothing" an upper surface of the topography. Therefore, such microscratches may remain on the topography and may increase reliability failures of a device formed on the topography. For example, if conductive material resides in a microscratch that extends across a width of a dielectric material between two conductive structures, a short may be formed between the two conductive structures. Other such reliability failures may also be caused by such microscratches.

Accordingly, it would be advantageous to develop a method and a system for reducing the number of microscratches formed on a semiconductor topography during polishing.

SUMMARY OF THE INVENTION

The problems outlined above may be in large part addressed by a method for processing a semiconductor topography. In an embodiment, the method may include polishing the topography on a polishing pad without depositing water on the polishing pad. In this manner, a pH of a polishing solution on the polishing pad may be substantially uniform during the polishing. For example, a pH of a polishing solution on the polishing pad may vary by less than about 2.5 during the polishing. In another embodiment, a pH of a polishing solution on the polishing pad may vary by less than about: 30% during the polishing. Such polishing may include, but is not limited to, a primary polishing step of a polishing process. The polishing process may also include a final polishing step performed subsequent to the primary polishing step.

In an embodiment, subsequent to the polishing, a substantial amount of residual slurry particles may be present on the topography. As described above, the polishing may include a primary polishing step of a polishing process. In another embodiment, subsequent to the polishing, the topography may be substantially free of agglomerated slurry particles. In a further embodiment, subsequent to the polishing, the topography may be substantially free of slurry particles having a particle size of greater than about 10 μm.

An additional embodiment relates to a semiconductor topography. The semiconductor topography may include a polished layer formed on the substrate. In an embodiment, the polished layer may be substantially planar. In this manner, the topography may be a topography formed by at least a primary polishing step. A substantial amount of residual slurry particles may be present on the polished layer. In an embodiment, the residual slurry particles may have a particle size of less than about 10 μm. In an additional embodiment, the polished layer may have less than about 200 microscratches formed thereon. In a further embodiment, a total number of defects present on the polished layer may be less than about 600.

A further embodiment relates to an additional method for processing a semiconductor topography. The method may include depositing water on a polishing pad in a plurality of dispense intervals during polishing of the topography to reduce a rate of change of a pH of a polishing solution on the topography. Such polishing may include, but is not limited to, a final polishing step of a polishing process. The polishing process may also include a primary polishing step performed prior to the final polishing step. In an embodiment, each of the plurality of dispense internals may include a dispense time of less than about 30 seconds. In an additional embodiment, one or more of the plurality of dispense internals may include a dispense time of less than about 3 seconds. The polishing solution may include a slurry present on the topography prior to polishing. In a further embodiment, additional polishing solution may not be deposited on the polishing pad during polishing. In an embodiment, the topography may include an upper layer of oxide formed across the topography. The oxide may be substantially planar subsequent to polishing.

An additional embodiment relates to another method for processing a semiconductor topography. The method may include polishing the topography on a primary polishing pad during a primary polishing step without depositing water on, the primary polishing pad. The method may also include transferring the topography from the primary polishing pad to the final polishing pad subsequent to the primary polishing step. In an embodiment, a substantial amount of residual slurry particles may be present on the topography during such transferring. The method may further include polishing the topography on a final polishing pad during a final polishing step. The final polishing step may include depositing water on the final polishing pad in a plurality of dispense intervals to reduce a rate of change of a pH of a polishing solution on the topography.

There may be several advantages to the various methods for processing a semiconductor topography as described herein. For example, a topography processed by a method as described herein may have fewer microscratches and fewer total defects than topographies processed by conventional methods. For example, conventional processes typically involve adding water to a slurry between a polishing pad and a topography in large quantities over a short period of time. Such a rapid pH transition, which may be commonly referred to as "pH shock," of a slurry may cause slurry particles to agglomerate irreversibly. Such agglomerated slurry particles may adhere to an upper surface of a topography being polished. During further steps in the process, the agglomerated particles detach from the upper surface of the topography and may cause microscratches to form in the upper layer. In this manner, reducing, and even, eliminating the rapid addition of large quantities of water to a slurry during the primary polishing step as described herein may cause fewer agglomerated particles to form. As such, the number of microscratches formed on a polished layer of a topography may be reduced. In addition, semiconductor devices formed on a topography having fewer microscratches and fewer total defects may have fewer reliability failures. Such a decrease in reliability failures in semiconductor devices may increase manufacturing yield and may reduce production costs per semiconductor device.

Furthermore, a final polishing step of a method as described herein may be shorter than conventional final polishing steps. For example, final polishing is often used to remove microscratches and other defects formed on a topography during a primary polishing step. Therefore, because fewer microscratches may be formed in a primary polishing step of a method as described herein than in conventional primary polishing steps, polishing time of a final polishing step may be reduced. A reduced polishing time for final polishing may reduce dishing of an upper, polished layer of a topography. For example, dishing may occur if polishing rates proximate an outer edge of a topography are slower than polishing rates proximate an inner portion of the topography. Therefore, discrepancies between a thickness of an upper layer proximate the outer edge of the topography and a thickness of the upper layer proximate the inner portion of the topography increase as polishing time increases.

In addition, reducing the time for a final polishing step as described herein may decrease the cost of consumables ("CoC") and cost of ownership ("CoO") for such polishing. For example, conventional final polishing steps, typically, include slurry reintroduction to increase removal rate as well as to sustain long buff times to compensate for microscratches and other defects formed during a primary polishing step. In an embodiment as described herein, however, a polishing solution such as a slurry may not be deposited on a polishing pad during a final polishing step. Therefore, reducing, and even substantially eliminating, addition of such slurry during the final polishing step will reduce the CoC by the cost of such slurry for a final polishing step. Similarly, the CoO for such processing may be reduced due to a shorter polishing time for the final polishing step.

BRIEF DESCRIPTION OF THE DRAWINGS

Other objects and advantages of the invention will become apparent upon reading the following detailed description and upon reference to the accompanying drawings in which.

Figure 1:
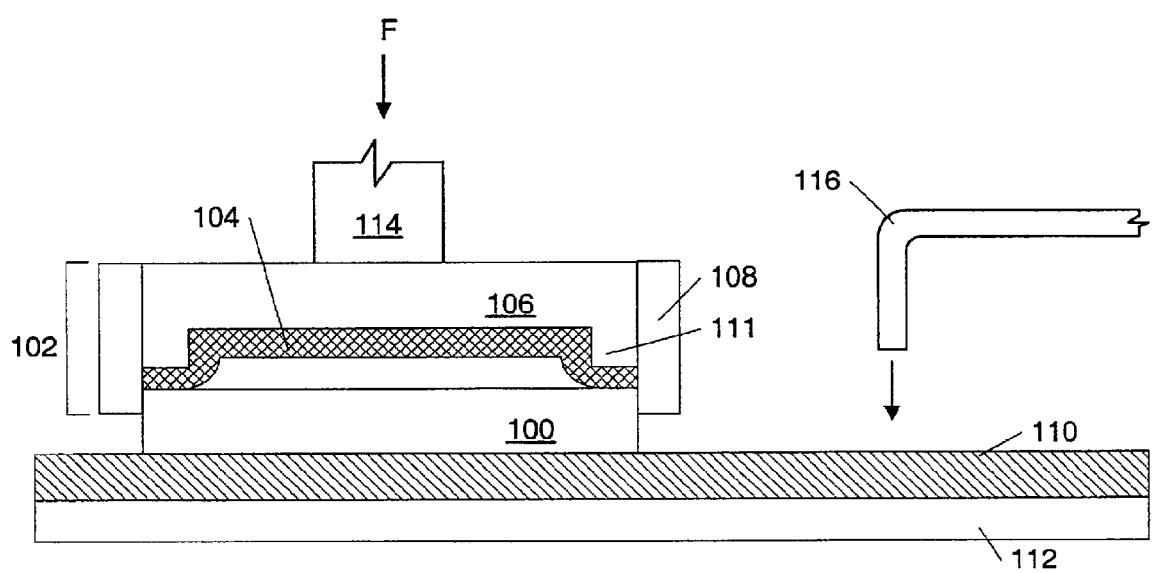
FIG. 1 depicts a partial cross-sectional view of a semiconductor topography pressed against a polishing pad in a chemical-mechanical polishing system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The following description generally relates to methods for processing a semiconductor topography. A semiconductor topography may be a semiconductor substrate with a substantially planar surface. Alternatively, a semiconductor topography may include one or more layers such as dielectric or metallization layers formed upon a semiconductor substrate. Another embodiment may include one or more structures such as gate structures, contact structures, and local interconnect wires formed upon or within a semiconductor substrate. And yet another embodiment may include diffusion regions and/or isolation regions formed upon or within a semiconductor substrate. In addition, one or more layers, structures, and/or regions may be combined to form a semiconductor topography. Such layers and structures may form a substantially planar or nonplanar upper surface. The upper surface may be polished and/or planarized by the system as described herein to form a substantially planar upper surface, reduce the thickness of an upper layer of the topography, and/or remove surface irregularities of a semiconductor topography.

"Polishing," as used herein (which may be used interchangeably with planarizing), refers to forming a substantially planar surface in an area of a topography on which functional semiconductor devices may be suitably fabricated. In other words, polishing preferably forms an area that includes a substantially planar surface having dimensional design specifications such that subsequently formed devices may be formed.

Generally, a chemical-mechanical polishing ("CMP") process may involve placing a semiconductor topography against a carrier plate of a wafer carrier to hold the topography relative to an underlying polishing pad. The carrier plate generally has a flat surface with which to receive the wafer. The wafer carrier may be moved toward the polishing pad such that the semiconductor topography contacts the polishing pad. The polishing pad may be made of various substances, depending on the material being polished. For example, a popular polishing pad medium includes polyurethane or polyurethane-impregnated polyester felts. During a typical CMP process, the polishing pad and/or the semiconductor topography may be set in motion while the semiconductor topography is forced against the polishing pad. For example, the polishing pad and the wafer may be placed on a rotatable table such that the wafer carrier and the polishing pad may be rotated relative to each other. Alternatively, the wafer carrier may be rotated relative to a fixed pad or vice versa. In another embodiment, the polishing pad may be a belt, which traverses against a fixed or rotating wafer. In either embodiment, the rotatable table, fixed pad, or belt may serve as the backing structure to which the polishing pad lies upon or is fixedly attached.

A polishing solution such as an abrasive, fluid-based chemical, often referred to as a "slurry", may be deposited upon the surface of the polishing pad. The polishing solution may occupy an interface between the polishing pad and the surface of the semiconductor topography. As such, elevationally extending features of the semiconductor topography may be positioned such that they may contact the polishing solution. The polishing solution may initiate the polishing process by chemically reacting with the surface material being polished. The movement of the polishing pad relative to the semiconductor topography may cause abrasive particles entrained within the slurry to physically strip the reacted surface material from the semiconductor topography. Such abrasive slurry particles may include, for example, silica, alumina, or ceria. Alternatively, a polishing solution substantially absent of abrasive particles may be used with an abrasive polish surface. Some factors that may influence the effect of any polishing solution used include the pH of the solution, the flow dynamics at the pad and semiconductor topography interface, and the etch selectivity of the solution with respect to materials within the semiconductor topography.

Turning to the drawings, an embodiment of a CMP system for processing a semiconductor topography according to the methods as described herein is illustrated in FIG. 1. The CMP system may be adapted to planarize a semiconductor topography in a polishing step. For example, the CMP system may be adapted to planarize a semiconductor topography in a primary polishing step or a final polishing step. Alternatively, the CMP system may be adapted to planarize a semiconductor topography in an entire polishing process. Such a system is not restricted to use in the semiconductor fabrication industry.

A CMP system, as shown in FIG. 1, includes wafer carrier 102 adapted to hold semiconductor topography 100. Wafer carrier 102 may include carrier backing film 104, carrier plate 106, and carrier ring 108. Backing film 104 may be coupled to carrier plate 106 in a manner with which to receive the backside of semiconductor topography 100. More specifically, semiconductor topography 100 may be placed in wafer carrier 102 such that backing film 104 contacts at least a portion of the backside of semiconductor topography 100. In addition, carrier ring 108 is preferably configured to hold semiconductor topography 100 in alignment with backing film 104. Subsequently, semiconductor topography 100 may be pressed against polishing pad 110 to polish the topography. Upon pressing semiconductor topography 100 against polishing pad 110, backing film 104 may be compressed such that additional portions of backing film 104 may come in contact with semiconductor topography 100. For example, backing film 104 may be compressed to contact a portion of semiconductor topography 100 adjacent to raised region 111 of carrier plate 106.

In addition to wafer carrier 102, the CMP system may include backing structure 112, polishing pad 10, shaft 114, and conduit 116. The CMP process may involve placing semiconductor topography 100 against backing film 104 and thus against carrier plate 106 to hold the topography relative to polishing pad 10. Downward force F may then be applied to shaft 114, which is attached to the backside of wafer carrier 106, to press semiconductor topography 100 against polishing pad 110, which lies on or is attached to backing structure 112. Backing structure 112 may include a rotatable table or platen, a fixed pad, or a belt. Wafer carrier 106 may hold semiconductor topography 100 on polishing pad 110 as the pad and/or the topography are moved relative to each other. A polishing solution such as a "slurry" including an abrasive and a fluid-based chemical may be deposited from conduit 116 positioned above polishing pad 110 onto the upper surface of the pad. The slurry may fill the space between pad 110 and the surface of semiconductor topography 100. The slurry may react with surface material on semiconductor topography 100. The movement of polishing pad 110 relative to semiconductor topography 100 causes abrasive particles entrained within the slurry to physically strip reacted surface material from semiconductor topography 100. In an alternative embodiment, the polishing solution may be substantially free of abrasive particles. In either embodiment, the pad itself may also physically remove some material from the topological surface of the semiconductor topography 100.

Figure 2:
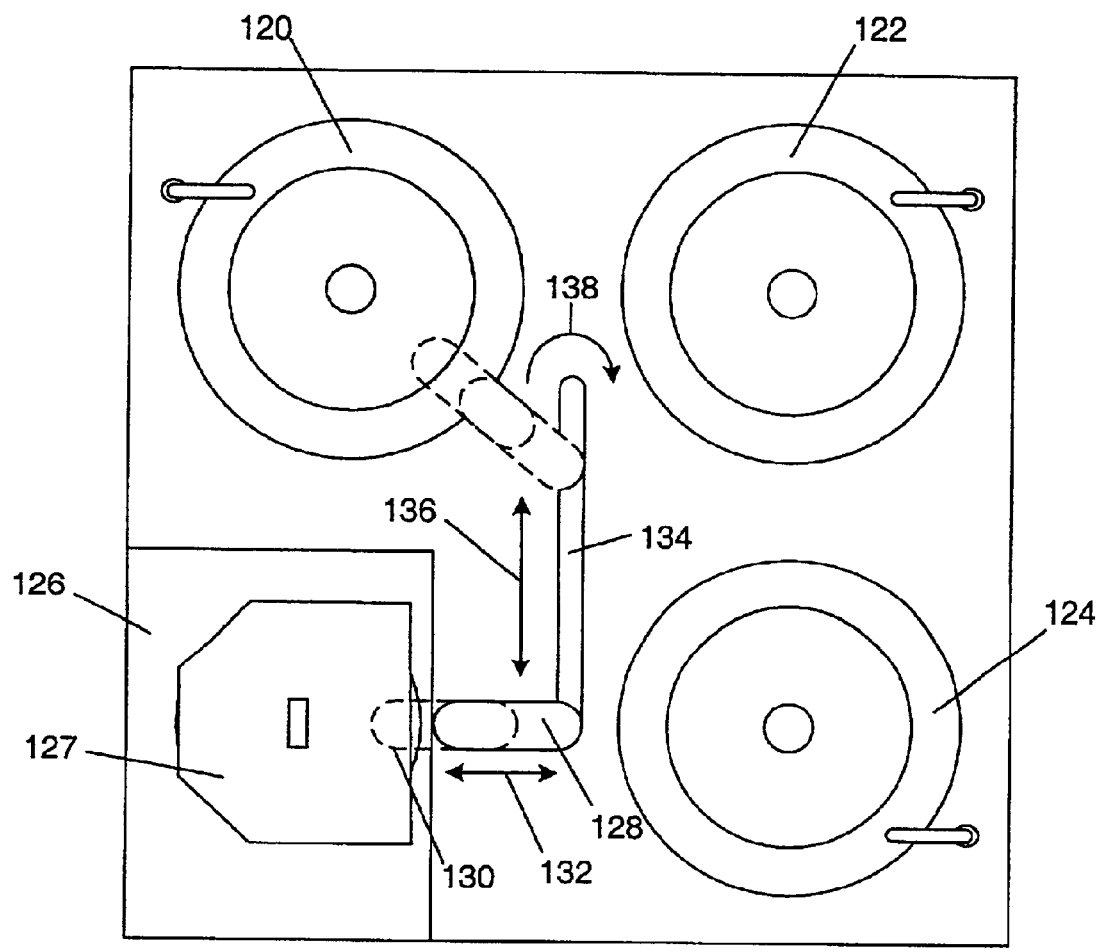
FIG. 2 depicts a top view of a chemical-mechanical polishing tool that includes more than one chemical-mechanical polishing system.

FIG. 2 illustrates a top view of an embodiment of a CMP tool that includes more than one CMP system for processing a semiconductor topography according to various embodiments of the methods as described herein. For example, the CMP tool may include CMP systems 120, 122, and 124, which may be configured as described above. Each CMP system may be configured to perform one polishing step of a polishing process. Alternatively, each CMP system may be configured to perform an entire polishing process. In addition, one or more of the CMP systems may be configured to perform the same polishing step or the same polishing process. In an alternative embodiment, one or more of the CMP systems may be configured to perform different polishing steps or different polishing processes. For example, CMP system 120 may be configured to perform a primary polishing step, and CMP system 122 may be configured to perform a final polishing step carried out subsequent to the primary polishing step. In this manner, CMP systems 120 and 122 may have different polishing pads and/or polishing solutions. CMP system 124 may also be configured to perform the same primary polishing step as CMP system 120, or CUT system 124 may be configured to perform an additional step prior to the primary polishing step or subsequent to the final polishing step.

The CMP tool may also include load station 126. Load station 126 may be configured to receive a plurality of semiconductor topographies in cassette 127 or another apparatus such as a front opening unified pod ("FOUP"). Although only one cassette is shown in FIG. 2, load station 126 may be configured to receive a plurality of cassettes or FOUP's. The CMP tool may also include handler 128. Handler 128 may be configured to remove a semiconductor topography from a cassette or FOUP in load station 126. For example, handler 128 may include arm 130, as shown in phantom in FIG. 2, that may move toward and away from load station 126 in a direction indicated by vector 132. Handler 128 may also be configured to move a semiconductor topography from the load station into CMP systems 120, 122, and 124. For example, handler 128 may be configured to move back and forth along rail 134 in a direction indicated by vector 136. In a similar manner as described above, arm 130 may extend into CMP system 120 to place a semiconductor topography into CMP system 120.

In addition, handler 128 may be configured to transfer a semiconductor topography from one CMP system to another CMP system. For example, after a primary polishing step performed in CMP system 120, handler 128 may transfer a semiconductor topography from CMP system 120 to CMP system 122 for a final polishing step. In such an example, handler 128 may remove a semiconductor topography from CMP system 120, rotate in a direction indicated by vector 138, and place the semiconductor topography into CMP system 122. Handler 128 may include a robotic device or any other mechanical device known in the art. The CMP tool may include any number of additional elements (not shown) known in the art such as, but not limited to, a power source, environmental controls, and a controller computer.

Figure 3:
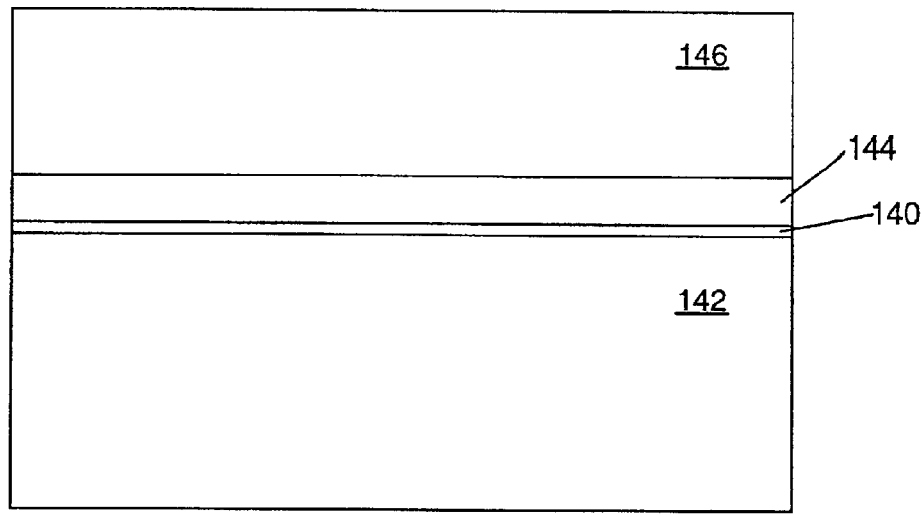
FIG. 3 depicts a partial cross-sectional view of a semiconductor topography in which an oxide layer, a polish stop layer, and a resist are formed upon a semiconductor layer.

Various embodiments of a method for processing a semiconductor topography as described herein are shown in FIGS. 3–8. FIG. 3 illustrates a partial cross-sectional view of an embodiment of a semiconductor topography in which oxide layer 140 may be formed upon and in contact with semiconductor layer 142. Polish stop layer 144 may be formed upon land in contact with oxide layer 140, and resist 146 may be formed upon and in contact with polish stop layer 144.

Semiconductor layer 142 may be a silicon substrate, and may in some embodiments be doped either n-type (for producing a p-channel transistor) or p-type (for an n-channel transistor). More specifically, semiconductor layer 142 may be an epitaxial silicon layer grown on a monocrystalline silicon substrate, or an n-type or p-type well region formed in a monocrystalline silicon substrate. Alternatively, semiconductor layer 142 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 142 may be substantially planar or may have substantial elevational differences due to the formation of such structures and layers. Diffusion regions (not shown) may also be formed in semiconductor layer 142. For example, diffusion regions may be lightly doped drain regions and heavily doped source/drain regions formed in a semiconductor layer adjacent to gate structures. Furthermore, the semiconductor topography may include shallow trench isolation regions formed within a semiconductor substrate or within a layer formed upon a substrate.

Oxide layer 140 may aid in the adhesion of polish stop layer 144 to semiconductor layer 142. For example, the inclusion of an oxide layer may promote adhesion of a silicon nitride layer, which may serve as polish stop layer 144, upon a silicon layer, which may serve as semiconductor layer 142. In another embodiment, oxide layer 140 may also serve as a "pad oxide" to reduce inherent stresses between a nitride polish stop layer and a silicon substrate. Oxide layer 140 may be grown upon semiconductor layer 142 using wet or dry thermal oxidation of a silicon substrate. Alternatively, oxide layer 140 may be deposited on semiconductor layer 142 using chemical-vapor deposition ("CVD") from, for example, a gas which may include $SiH_4$ and $O_2$. Oxide layer 140 may include a dielectric layer, such as silicon dioxide ($SiO_2$), tetraorthosilicate glass (TEOS), or silicon dioxide/silicon nitride/silicon dioxide (ONO). Alternatively, polish stop layer 144 may be formed upon semiconductor layer 142 without oxide layer 140.

Polish stop layer 144 may serve to protect portions of underlying layers and structures within semiconductor layer 142. For example, polish stop layer 144 may protect portions of oxide layer 140 and semiconductor layer 142 from an etch process, which may be used to form trenches within semiconductor layer 142. Polish stop layer 144 may also serve as a stop layer for polishing processes as described herein. In this manner, the polishing of overlying layers may be substantially terminated upon exposing polish stop layer 144. Consequently, structures or layers formed upon semiconductor layer 142 adjacent to polish stop layer 144 may also be polished to approximately the same elevation level as polish stop layer 144. Alternatively, structures or layers formed upon semiconductor layer 142 adjacent to polish stop layer 144 may also be recessed to an elevational level below polish stop layer 144. Polish stop layer 144 may include silicon nitride deposited by thermally decomposing silane and ammonium in a chemical vapor deposition process maintained at a temperature in the range of approximately 200° C. to approximately 800° C. Appropriate materials for polish stop layer 144, however, may also include any material having a substantially different polish response mL than an upper layer as described herein.

Figure 4:
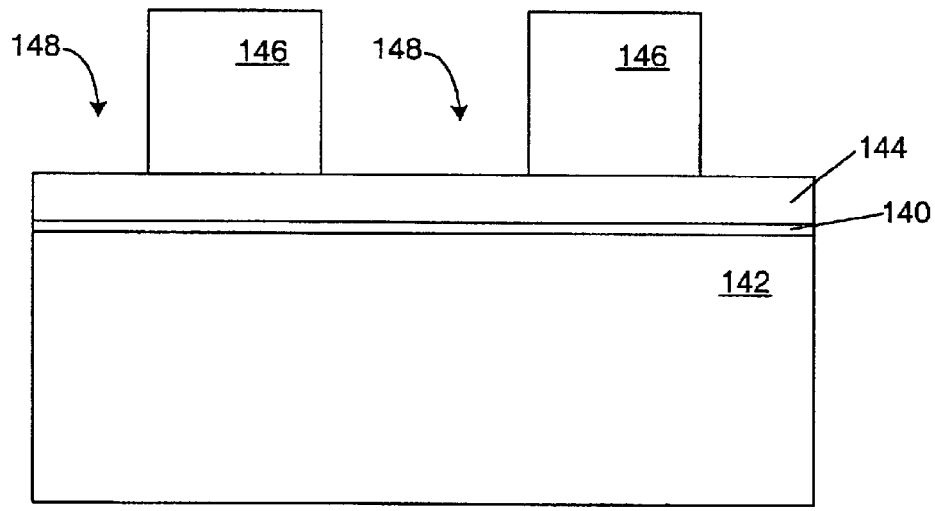
FIG. 4 depicts a partial cross-sectional view of a semiconductor topography in which the resist is patterned subsequent to the resist formation of FIG. 3.
Figure 5:
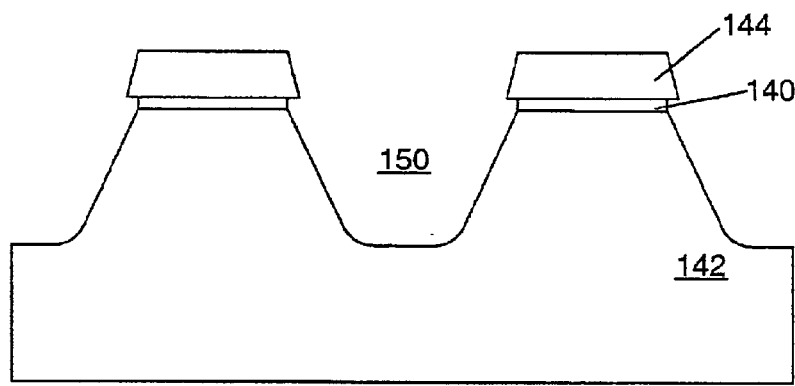
FIG. 5 depicts a partial cross-sectional view of a semiconductor topography in which trenches are formed within the semiconductor layer subsequent to the patterning of FIG. 4.

In an embodiment, resist 146 may be formed upon polish stop layer 144. Resist 146 may include a photoresist, such as a deep ultraviolet resist, an I-line resist, a G-line resist, or another resist, such as an e-beam resist or an x-ray resist. Resist 146 may be patterned using a lithography technique, thus exposing portions 148 of polish stop layer 144, as shown in FIG. 4. Exposed portions 148 of polish stop layer 144 and underlying portions of oxide layer 140 and semiconductor layer 142 may be etched to form trenches 150 as shown in FIG. 5. The etch process may include wet etch and/or dry etch techniques. Although sidewalls of the trenches are shown to be at an angle to a floor of the trenches, the sidewalls of the trenches may also be substantially perpendicular to the floor of the trenches. For example, an angle of the sidewalls with respect to the floor of a trench may vary depending on etch conditions such as, but not limited to, etchant composition, power, and pressure. The patterned photoresist may then be removed by a stripping process such as a wet etch process or a reactive ion etch stripping process.

Figure 9:
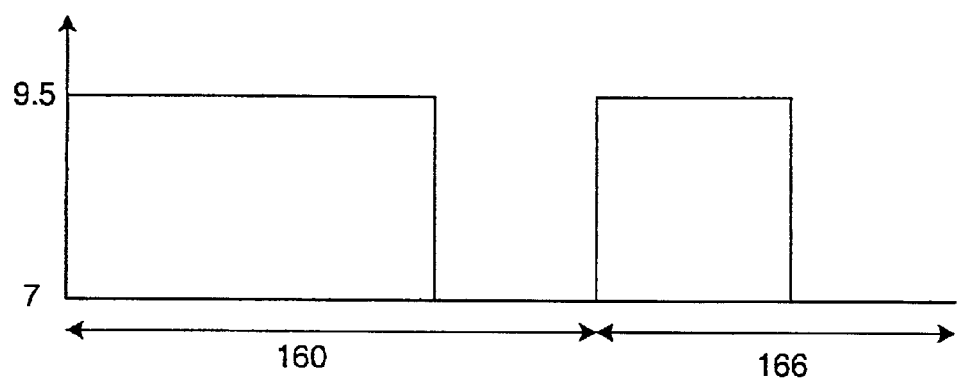
FIG. 9 depicts a graph illustrating the pH of a polishing solution on a polishing pad over time during a conventional CMP process.

Trenches 150 may be used to form shallow trench isolation regions within semiconductor layer 142. Isolation regions may be field oxide regions, which may serve to isolate separate active regions on semiconductor layer 142 from one another. Although FIG. 5 illustrates the formation of three partial trenches across the illustrated portion of semiconductor layer 142, any number of trenches in any spatial configuration may be formed across the semiconductor layer in accordance with design specifications of the device. In addition, various widths and depths of the trenches may be formed in accordance with the design specifications of the device. Furthermore, the scale of trenches 150 in relation to the other portions of the semiconductor topography is greatly exaggerated to emphasize details of the topography as a result of a subsequent polishing steps as shown in the embodiments of FIGS. 6, 7, and 9.

Figure 6:
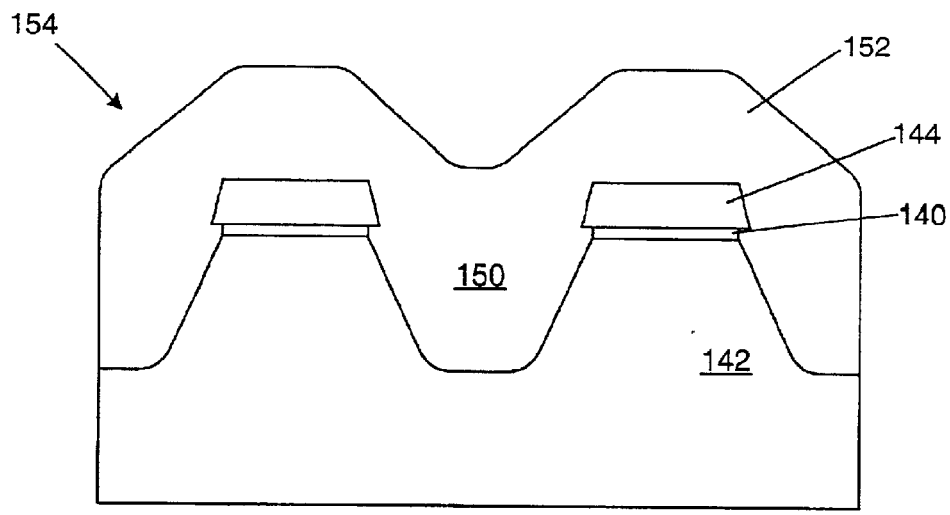
FIG. 6 depicts a partial cross-sectional view of a semiconductor topography in which an upper layer is formed within the trenches and above the polish stop layer subsequent to the trench formation of FIG. 5.
Figure 7:
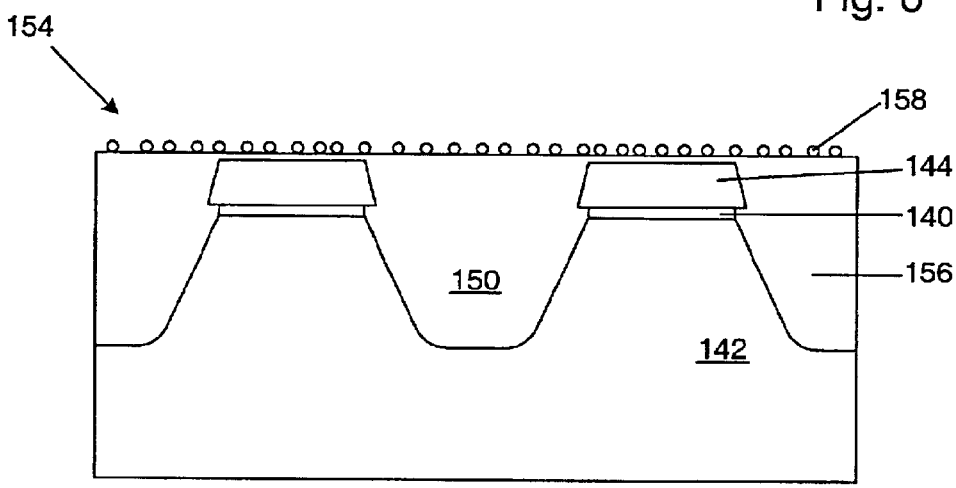
FIG. 7 depicts a partial cross-sectional view of a semiconductor topography in which the semiconductor topography of FIG. 6 is polished without depositing water on a polishing pad.

FIG. 6 illustrates filling trenches 150 with upper layer 152. Upper layer 152 may also be formed upon an upper surface of polish stop layer 144, which may be formed adjacent to trenches 150. Generally, upper layer 152 may be deposited conformally and thus, may have a non-planar upper surface as shown in FIG. 6. Alternatively, upper layer 152 may be relatively planar if the underlying structures and layers are substantially planar before the deposition of upper layer 152. The planarity of the upper layer may be defined by the thickness variation of the upper layer across the entirety of the semiconductor topography with respect to an underlying plane within the topography. On the other hand, the planarity of the upper layer may be determined by measuring an average thickness of the layer in one region of the semiconductor topography as compared to the average thickness of the layer in another region of the semiconductor topography. The thickness of upper layer 152 may vary depending on the semiconductor device being formed. The structure of upper layer 152 upon semiconductor layer 142 may be referred to as semiconductor topography 154.

In an embodiment, upper layer 152 may include any of various layers used in semiconductor fabrication. For example, upper layer 152 may include a polymetal dielectric layer or an intermetal dielectric layer. For example, upper layer 152 may include silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). In addition, upper layer 152 may be silicon dioxide deposited by a CVD process, which may be nitrided in a subsequent processing step. Upper layer 152 may also be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In another embodiment, upper layer 152 may be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$). Upper layer 152 may be undoped or may be doped to form, for example, BPSG, PSG, or FSG.

Alternatively, upper layer 152 may include a conductive material, such as polysilicon, aluminum, copper, titanium, or a metal alloy. Furthermore, because copper diffuses readily through silicon and oxide, and undesirably alters the electrical properties of transistors formed in silicon, a liner may be deposited on the semiconductor layer before deposition of a copper layer. A liner may preferably be formed from a conductive material, which acts as a diffusion barrier to the overlying copper, and also adheres well to semiconductor layer 142. Materials typically used as a liner, which is often called a diffusion barrier and/or an adhesion layer, may include metal nitrides such as titanium nitride and tantalum nitride, and refractory alloys such as titanium-tungsten. A copper layer may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing a copper layer, but other techniques, including CVD, may be used as well.

Figure 8:
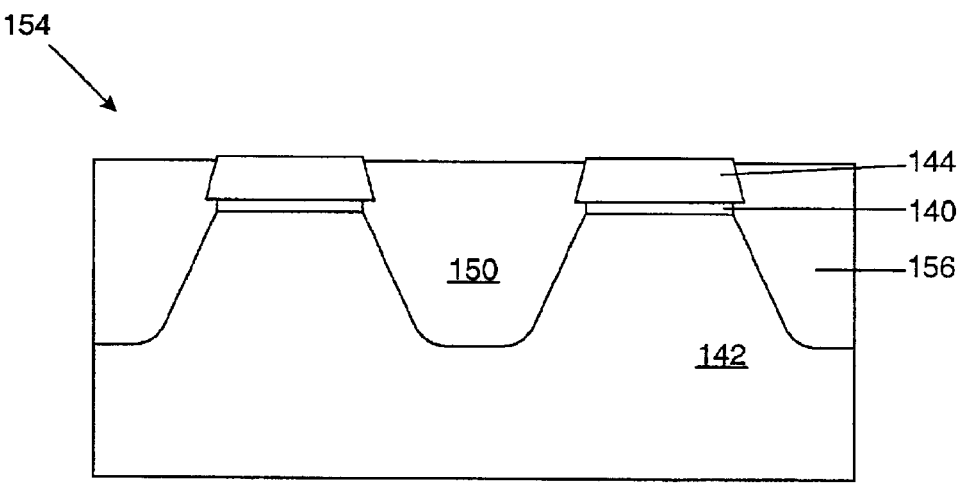
FIG. 8 depicts a partial cross-sectional view of a semiconductor topography in which the semiconductor topography of FIG. 7 is polished by a final polishing step of a CMP process.

FIG. 7 illustrates polishing semiconductor topography 154 on a polishing pad. An amount of water deposited on the semiconductor topography during such polishing may be reduced, and even eliminated. For example, polishing the semiconductor topography may be performed without depositing water on the polishing pad. In an embodiment, such polishing may be a primary polishing step of a polishing process. In an alternative embodiment, such polishing may be substantially an entire polishing process. As shown in FIG. 7, semiconductor topography 154 may include polished layer 156. Polished layer 156 may substantially include portions of upper layer 152 (shown in FIG. 6) formed within trenches 150. The polished layer may have an upper surface that is substantially planar subsequent to polishing. The upper surface of polished layer 156 may not be co-planar with an upper surface of underlying polish stop layer 144 as shown in FIG. 7. An upper surface of polished layer 156, however, may also be approximately co-planar with an upper surface of underlying polish stop layer 144, as shown in FIG. 8.

A primary polishing step may include, for example, three phases. Each of the three phases may include depositing a polishing solution upon the polishing pad at a flowrate of approximately 150 ml/min to approximately 250 ml/min. Each of the three phases, however, may not include depositing water on the polishing pad. Spin speeds of the platen and carrier may be approximately the same in the first two phases and may be increased in the third phase. For example, the spin speeds in the first two phases may be about 25 rpm to about 35 rpm, and the spin speeds in the third phase may be about 35 rpm to about 50 rpm. The downforce on the carrier and the back pressure on the semiconductor topography may be increased as polishing process proceeds through each of the three phases. The duration of the first two phases may be relatively short (i.e., approximately 2 seconds to approximately 8 seconds). The duration of the third phase may vary depending on, for example, the amount of material to be removed from semiconductor topography 154. In this manner, the duration of the third phase may be determined based on an initial thickness of upper layer 152 and the parameters of the third phase of polishing. Alternatively, the duration of the third phase may be determined dynamically by a measurement instrument coupled to a CMP system. Furthermore, a primary polishing step may include any number of such phases. In addition, the flowrates, spin speeds, downforces, and durations described above may also vary depending upon, for example, the type of material being polished and an initial thickness of upper layer 152.

The polishing solution deposited upon semiconductor topography 154 may include a slurry having a pH of about 9.5 to about 11.5 depending on the type of slurry that is used. Examples of types of slurries that are commercially available include, but are not limited to, the Klebosol® slurry products available from Rodel, Inc., Phoenix, Ariz. and Semi-Sperse® slurry products available from Cabot Microelectronics Corporation, Aurora, Ill. An appropriate polishing solution may be selected depending on, for example, a material of upper layer 152. The polishing solution, however, may have a pH as low as about 2.5 in some instances.

Polishing semiconductor topography 154 without depositing water on the polishing pad will reduce variations in a pH of a polishing solution on the polishing pad. For example, depositing water on a polishing pad will essentially dilute the polishing solution until the mixture of water and polishing solution on the polishing pad has approximately a pH of water (i.e., about 7). Therefore, reducing, and even eliminating, deposition of water on a polishing pad during polishing will reduce variations in a pH of a polishing solution on a polishing pad. For example, a pH of the polishing solution may vary by less than about 2.5 during polishing. More specifically, a pH of the polishing solution may vary by less than about 30% during polishing, and even less than about 5% during polishing. Furthermore, in a preferred embodiment, a pH of a polishing solution on the polishing pad may be substantially uniform during such polishing. For example, the pH of a polishing solution on a polishing pad may have negligible variations during such polishing due only to negligible variations in the pH of the polishing solution as commercially supplied.

As shown in FIG. 7, semiconductor topography 154 will have a substantial amount of residual slurry particles 158 present on polished layer 156 subsequent to such polishing. For example, in conventional polishing processes, relatively large amounts of water are deposited onto a polishing pad during polishing to remove such residual slurry particles. Therefore, a semiconductor topography polished by such a conventional process will be substantially free of residual slurry particles. In contrast, as shown in FIG. 7, semiconductor topography 154 may have thousands of residual slurry particles 158 present on the topography depending on the size of the semiconductor topography.

The topography, however, may be substantially free of agglomerated slurry particles. Agglomerated slurry particles may include one or more slurry particles clustered together. Agglomerated slurry particles may form by flocculation. Flocculation is the process whereby relatively small particles clump together like a bunch of grapes, commonly referred to as a "flocs," but do not fuse into a new particle. In flocculation, there is no reduction of surface, although certain surface sites may be blocked at the points at which the smaller particles touch. Such agglomerated slurry particles may have a particle size of greater than about 10 $\mu$m. The size of such agglomerated slurry particles may vary, however, depending on, for example, an average size of non-agglomerated slurry particles. For example, agglomerated slurry particles may have a particle size of about 100 to about 1000 times that of non-agglomerated slurry particles. Non-agglomerated slurry particles may have an average particle size, for example, of about 0.1 $\mu$m.

Figure 10:
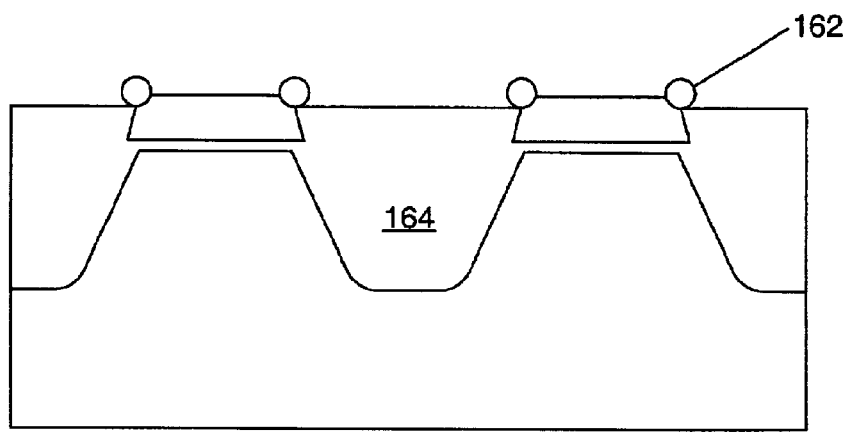
FIG. 10 depicts a partial cross-sectional view of a semiconductor topography in which the semiconductor topography of FIG. 6 is polished by a conventional CMP process.

Maintaining a substantially uniform pH of a polishing solution will reduce the formation of agglomerated slurry particles. In general, however, conventional CMP steps and processes do not include such maintaining and/or controlling the pH of the polishing solution. For example, during conventional polishing processing, polishing solutions such as slurries tend to undergo a pH shock when water is added to a slurry in relatively large quantities over a relatively short amount of time. In this manner, pH shock may be induced by the rapid pH transition of the slurry from about 9.5 or about 11.5 to about 7. For example, FIG. 9 is a plot of pH of a polishing solution on a polishing pad during a conventional polishing process. pH of a polishing solution is plotted on the y-axis, and time is plotted on the x-axis. As shown in FIG. 9, an initial pH of the polishing solution may be approximately 9.5. Portion 160 of polishing process may include a primary polishing step of the polishing process. As further shown in FIG. 9, during the primary polishing step, the pH of the polishing solution decreases rapidly from about 9.5 to about 7 (i.e., about the pH of water). The rapid decrease in the pH of the polishing solution may occur shortly after the rapid introduction of water onto the polishing pad during a rinse step of the primary polishing step. During the rapid pH transition, the slurry particles may become irreversibly agglomerated and may attach to an upper surface of the semiconductor topography being polished. As shown in FIG. 10, for example, agglomerated particles 162 may become trapped in elevational disparities of the topography such as dishing of material 164 in isolation trenches.

During further steps in the polishing process such as portion 166 of the polishing process as shown in FIG. 9, such trapped agglomerated particles and agglomerated particles attached to the topography in any other way may break loose from the topography and may cause microscratches. Microscratches may include scratches of any length having a width of less than about 0.5 $\mu$m. Such microscratches may have a depth of up to about 100 Å and may be relatively difficult to remove during final stages of polishing on a final pad. For example, final pad polishing may typically be designed to remove relatively little material from a topography thereby essentially "smoothing" an upper surface of the topography.

Conventional methods used correct microscratches include extending the duration of final pad polishing. In addition, some conventional methods for correcting microscratches include slurry reintroduction during final pad polishing to increase the removal rate thereby attempting to correct microscratches formed on a topography. The reintroduction of slurry during a final polishing step is shown by the rapid increase in the pH of the polishing solution after portion 160 of the polishing process shown in FIG. 9. Conventional final pad polishing, however, also involves rapid water introduction that may induce pH shock of the slurry used for the final pad polishing, as shown in the rapid decrease in the pH of the polishing solution during portion 166. Therefore, additional microscratches may be formed during final pad polishing.

For at least these reasons, even with extended final pad polishing, the microscratch count of a topography polished by conventional methods may be significantly higher than a microscratch count of a topography polished according to an embodiment described herein. For example, a polished layer formed on a semiconductor topography such as polished layer 156, as shown in FIG. 7, may have less than about 200 microscratches per topography, which may be about 60% to about 70% fewer microscratches on a similar sized topography polished by conventional methods. Such a topography may also have significantly fewer total defects than a topography polished using a conventional method. For example, a total number of defects present on polished layer 156 of the semiconductor topography may be less than about 600, which may be about 30% to about 40% fewer total defects present on a topography polished using a conventional method. The number of microscratches and total defects may vary, of course, depending on the lateral dimensions of the semiconductor topography. Furthermore, the reduction in the number of microscratches formed on a polished layer of a topography polished according to an embodiment as described herein may increase as the pH of the polishing solution is farther away from the pH of water (i.e., about 7).

In an embodiment, if the polishing described above is a primary polishing step, semiconductor topography 154 may be transferred to a final polishing step with residual slurry particles 158 present on the topography. As such, a pH transition does not take place on the primary polishing pad during the primary polishing step. In an alternative embodiment, if the polishing described above is substantially an entire polishing process, semiconductor topography 154 may be transferred to a cleaning step with the residual slurry particles present on the topography. The cleaning step may include, for example, immersing the semiconductor topography in a solution designed to remove the residual slurry particles from the topography without abrading the particles against polished layer 156. Such a cleaning step may include, however, any post-CMP cleaning step known in the art. In this manner, topography 154 may be substantially free of residual slurry particles subsequent to a cleaning step as shown in FIG. 8.

FIG. 8 illustrates another embodiment of polishing semiconductor topography 154 on a polishing pad. The polishing may include depositing water on a polishing pad in a plurality of dispense intervals during polishing of topography 15. In an embodiment, such polishing may be a final polishing step of a polishing process performed subsequent to a primary polishing step as described above. In such an embodiment, no additional polishing solution such as a slurry may be deposited on a final polishing pad during the final polishing step. As such, the polishing solution on the final polishing pad includes the slurry present on the topography prior to the polishing. In an alternative embodiment, such polishing may be substantially an entire polishing process. Polished layer 156 may have an upper surface that is substantially planar subsequent to polishing, as shown in A final polishing step may include, for example, six phases. Spin speeds of the platen and carrier may be approximately the same in the six phases and may be less than spin speeds of the platen and carrier in a primary polishing step. For example, the spin speeds in the final polishing stop may be about 10 rpm to about 25 rpm. The downforce on the carrier and the back pressure on the semiconductor topography may also be approximately the same in the six phases and may be less than the downforces on the carrier and the back pressures on the semiconductor topography during a primary polishing step. Water may be deposited upon the polishing pad in relatively short dispense intervals that may include ovary other phase of the polishing (i.e. the second, fourth, and sixth phases). In an embodiment, each of the dispense intervals may have a dispense time of less than about 30 seconds. In an additional embodiment, one or more of the dispense intervals may have a dispense time of less than about 3 seconds, or even about 1 second. In a further embodiment, the first several dispense intervals may have shorter dispense times that later dispense intervals. For example, the second and fourth phases of the above described process may have dispense times of less about 1 second while the sixth phase may have a dispense time of about 30 seconds. Furthermore, a final polishing step may include any number of such phases. In addition, the flowrates, spin speeds, down forces, and durations described above may also vary depending upon, for example, the type of material being polished and an initial thickness of upper layer 152.

Depositing water on a polishing pad in a plurality of dispense intervals during polishing as described above will reduce a rate of change of the pH of a polishing solution on topography 154 in comparison to conventional processes. Therefore, for at least the reasons described above, reducing a rate of change of the pH will reduce the number of microscratches formed on topography 154. In an embodiment, a topography polished by depositing water on a polishing pad in a plurality of dispense intervals may include a polished layer such as polished layer 156 having less than about 200 microscratches. The number of microscratches may vary, depending upon the size of the topography, but the number of microscratches on a topography polished using an embodiment of a process as described herein may have about 60% to about 70% fewer microscratches than a similarly sized topography polished by a conventional method. For example, conventional methods may include depositing a relatively large amount of water on a polishing pad in one dispense interval having a duration of about 60 seconds. Therefore, as described above, the polishing solution may undergo pH shock, which may cause the formation of agglomerated slurry particles on a surface of a topography being polished thereby increasing the number of microscratches formed on the topography. Furthermore, the reduction in the number of microscratches formed on an upper layer of a topography polished according to an embodiment as described herein may increase as the pH of the polishing solution is farther away from the pH of water (i.e., about 7). In addition, such a plurality of relatively short dispense intervals will be effective to remove substantially all of the residual slurry particles (as shown in FIG. 7) from an upper surface of topography 154 as shown in FIG. 8.

Furthermore, as described above, no additional polishing solution is deposited on a final polishing pad during the final polishing step. In this manner, topography 154 may be polished during the final polishing step with the residual slurry particles 158 left on the surface after a primary polishing step as shown in FIG. 7. In contrast, conventional final polishing steps often involves depositing additional slurry on a final polishing pad to remove microscratches and other defects formed on a topography during a primary polishing step. A primary polishing step, as described in an embodiment herein, however, forms fewer microscratches than conventional polishing. As such, the amount of polishing that topography 154 is subjected to during such a process is reduced in comparison to conventional methods thereby reducing the amount of dishing that occurs in polished layer 156 on topography 154. For example, dishing may occur if polishing rates proximate an outer edge of a topography are slower than polishing rates proximate an inner portion of the topography. Therefore, discrepancies between a thickness of an upper layer proximate the outer edge of the topography and a thickness of the upper layer proximate the inner portion of the topography increase as polishing time increases. In an embodiment, if an upper layer of topography 154 includes oxide, for example, the oxide may be substantially planar subsequent to such polishing. In an additional embodiment, about 10% to about 20% less dishing may occur in polished layer 156 than a layer polished by a conventional method. In addition, reducing the time for a final polishing step may decrease the cost of consumables ("CoC") and cost of ownership ("CoO") for such polishing as described above.

Figure 11:
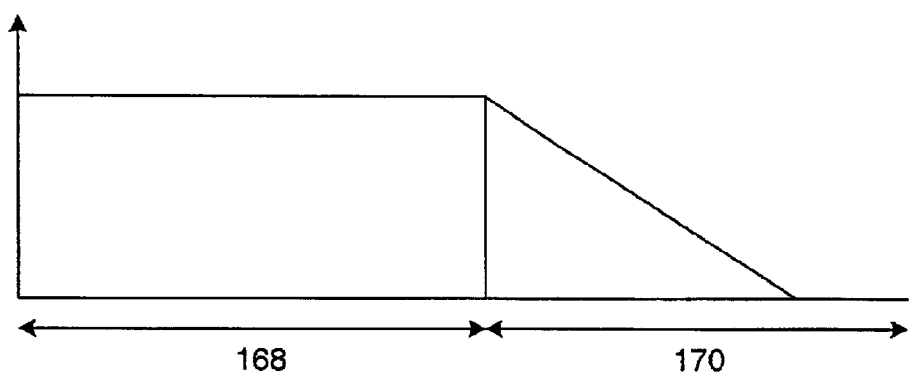
FIG. 11 depicts a graph illustrating the pH of a polishing solution on a polishing pad over time during an embodiment of a CMP process as described herein.

FIG. 11 illustrates an additional embodiment of a method for processing a semiconductor topography. pH of a polishing solution used to polish a semiconductor topography is plotted on the y-axis, and time is plotted on the x-axis. The method may include polishing the topography on a primary polishing pad during a primary polishing step without depositing water on the primary polishing pad as described above. The primary polish step is indicated as portion 168 of process as shown in FIG. 11. As shown in portion 168, a pH of the polishing solution may be substantially uniform throughout the primary polishing step. The method may also include transferring the topography from the primary polishing pad to the final polishing pad subsequent to the primary polishing step. In an embodiment, a substantial amount of residual slurry particles may be present on the topography during such transferring. The method may further include polish ing the topography on a final polishing pad during a final polishing step. The final polishing step may include depositing water on the final polishing pad in a plurality of dispense intervals to reduce a rate of change of a pH of a polishing solution on the topography. The final polishing step is indicated as portion 170 of process as shown in FIG. 11. As shown in portion 170, a pH of the polishing solution may be reduced relatively slowly during the final polishing step.

Referring back to FIG. 8, the process may include exposing an upper surface of polish stop layer 144. As such, other structures and layers may be elevationally adjacent to polish stop layer 144 subsequent to the planarizing process. In this manner, the upper surface of the topography subsequent to planarizing may be of substantially uniform elevation. Thus, an upper surface of polished layer 156 within the isolation trenches may be substantially coplanar with an upper surface of polish stop layer 144 to form isolation regions 150 in semiconductor layer 142. Alternatively, the process may include planarizing the upper surface of the upper layer to a level spaced above or below the polish stop layer. In some cases, the process may include etching a portion of polish stop layer 144. As such, the thickness of polish stop layer 144 may be reduced along with a portion of polished layer 156. In either case, a semiconductor device may be formed on semiconductor topography since the upper surface of the topography is substantially planar.

Figure 12:
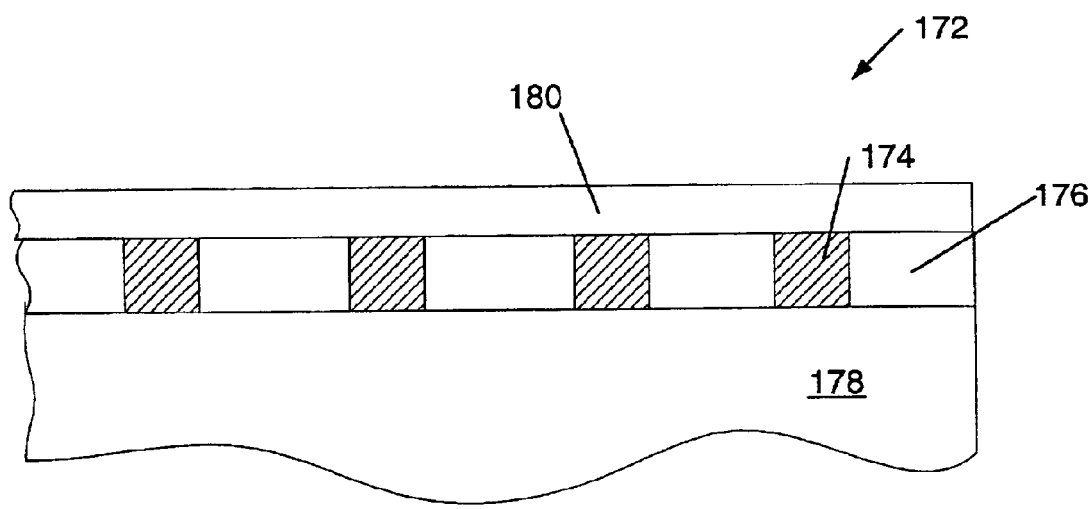
FIG. 12 depicts a partial cross-sectional view of a semiconductor topography, in an alternative embodiment, in which a polished upper layer is arranged upon conductive structures interposed within a dielectric layer, wherein the conductive structures and dielectric layer are arranged upon a device layer.

FIG. 12 illustrates an embodiment of a semiconductor topography planarized using the method as described herein. In particular, FIG. 12 depicts semiconductor topography 172, which includes conductive structures 174 arranged within dielectric 176 arranged upon device layer 178. Moreover, upper layer 180 may be arranged upon conductive structures 174 and dielectric 176. Device layer 178 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. Diffusion regions (not shown) may also be formed in device layer 178. For example, diffusion regions may be lightly doped drain regions and heavily doped source/drain regions formed in the semiconductor substrate adjacent to gate structures. Furthermore, the semiconductor topography may include shallow trench isolation regions formed within a semiconductor substrate or within a layer formed upon a substrate. Alternatively, device layer 178 may be a silicon substrate. More specifically, device layer 178 may be an epitaxial silicon layer grown on a monocrystalline silicon substrate.

Conductive structures 174 may include gate structures, contact structures, local interconnect wires, or metallization layers. As such, dielectric 176 may include an interlevel dielectric. In addition, upper layer 180 may include an interlevel dielectric or a passivation layer. In some embodiments, upper layer 180 may be of the same material as dielectric 176. Alternatively, the upper layer 180 and dielectric 176 may include different; materials. The planarized surface of layer 156 as shown in FIG. 8 may be substantially planar. In this manner, the thickness of upper layer 180 may be approximately uniform across the entirety of semiconductor topography 172. As with the polishing processes of FIGS. 7 and 8, the planarizing process used to polish upper layer 180 is preferably adapted to form fewer microscratches in layer 180 than may be formed by conventional processes, i.e. processes that include depositing relatively large amounts of water on a polishing pad in a relatively short amount of time. As such, the number of microscratches formed in upper layer 172 across semiconductor topography 172 may be about 60% to about 70% less than the number of microscratches formed in a similarly sized topography.

It will be appreciated to those skilled in the art having the benefit of this disclosure that this invention is believed to provide methods for processing a semiconductor topography. Further modifications and alternative embodiments of various aspects of the invention will be apparent to those skilled in the art in view of this description. For example, the methods described herein could be applied not just to planarizing a layer formed upon a semiconductor layer, but to planarizing any semiconductor feature or layer. Moreover, the methods and systems described herein may be used for any type of polishing applications, including polishing systems not used in the semiconductor industry. In addition, the method and devices described herein may be adapted for wafers of any size (e.g., 6 inch, 8 inch, or 12 inch diameter wafers). Furthermore, the number or microscratches on a semiconductor topography obtained by the methods as described herein may vary with wafer size. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising;
    polishing the semiconductor topography with a polishing pad while simultaneously depositing a polishing solution on the polishing pad;
    terminating the deposition of the polishing solution or the polishing pad;
    subsequently polishing the semiconductor topography with the polishing pad having residual amounts of the polishing solution thereon; and
    depositing water on the polishing pad in a plurality of dispense intervals during the step of subsequently polishing the semiconductor topography to reduce a rate of change of a pH of the residual amounts of polishing solution on the polishing pad, wherein the step of depositing the water is conducted subsequent to starting the step of subsequently polishing the semiconductor topography.

2. The method of claim 1, wherein one or more of the plurality of dispense intervals comprise a dispense time of less than about 30 seconds.

3. The method of claim 1, wherein one or more of the plurality of dispense intervals comprise a dispense time of less than about 3 seconds.

4. The method of claim 1, wherein the polishing solution comprises slurry present on the topography prior to the polishing.

5. The method of claim 1, wherein additional polishing solution is not deposited on the polishing pad during the polishing.

6. The method of claim 1, wherein the topography comprises an upper layer of oxide formed across the topography, and wherein the oxide is substantially planar subsequent to the polishing.

7. A method for processing a semiconductor topography, comprising:
    polishing the topography with a polishing solution on a primary polishing pad during a primary polishing step without adding water to the polishing solution that is on the primary polishing pad during the polishing; and
    polishing the topography on a final polishing pad during a final polishing step, comprising depositing water on the final polishing pad in a plurality of dispense intervals to reduce a rate of change of a pH of a polishing solution on the topography.

8. The method of claim 7, further comprising transferring the topography from the primary polishing pad to the final polishing pad subsequent to the primary polishing a step, wherein a substantial amount of residual slurry particles are present on the topography during the transferring.

9. The method of claim 7, wherein a pH of the polishing solution is approximately equal to a pH of the polishing solution as commercially supplied.

10. The method of claim 1, wherein the water has a pH of about 7.

11. The method of claim 1, wherein a pH of the polishing solution on the polishing pad is substantially uniform during the step of subsequently polishing.

12. The method of claim 1, wherein a pH of the polishing solution on the polishing pad varies by loss than about 30% during the step of subsequently polishing.

13. The method of claim 7, wherein the step of depositing the water is conducted subsequent to starting the step of polishing the topography on the final polishing pad.

14. The method of claim 7, further comprising depositing the polishing solution on the primary polishing pad during the step of polishing the topography on the primary polishing pad.

15. The method of claim 7, wherein water is not added to the polishing solution before the polishing solution is deposited on the primary polishing pad.

16. The method of claim 7, wherein each of the plurality of dispense intervals comprise a dispense time of less then about 30 seconds.

17. The method of claim 7, wherein a pH of the polishing solution on the final polishing pad varies by less than about 2.5 during the step of polishing the topography on the final polishing pad.

18. The method of claim 7, wherein subsequent to the step of polishing the topography on the primary polishing pad, a substantial amount of residual slurry particles are present on the topography.

19. The method of claim 7, wherein subsequent to the step of polishing the topography on the final polishing pad, the topography is substantially free of agglomerated slurry particles.

20. The method of claim 7, wherein subsequent to the step of polishing the topography on the final polishing pad, the topography is substantially free of slurry particles having a particle size greater than about 10 $\mu$m.

* * * * *

UNITED STATES PATENT AND TRADEMARK OFFICE
CERTIFICATE OF CORRECTION

PATENT NO. : 6,863,595 B1
DATED : March 8, 2005
INVENTOR(S) : Zagrebelny

It is certified that error appears in the above-identified patent and that said Letters Patent is hereby corrected as shown below:

Column 18,
Line 7, please delete "or" and substitute therefor -- on --.
Line 19, please delete "one or more" and substitute therefor -- each --.
Line 59, please delete "loss" and substitute therefor -- less --.

Column 19,
Line 5, please delete "then" and substitute therefor -- than --.

Signed and Sealed this

Eleventh Day of October, 2005

JON W. DUDAS
*Director of the United States Patent and Trademark Office*